United States Patent
Patel et al.

(10) Patent No.: US 9,169,340 B2
(45) Date of Patent: *Oct. 27, 2015

(54) ELECTRONIC DEVICE MODULE COMPRISING AN ETHYLENE MULTI-BLOCK COPOLYMER

(71) Applicant: Dow Global Technologies LLC, Midland, MI (US)

(72) Inventors: Rajen M. Patel, Lake Jackson, TX (US); Shaofu Wu, Sugar Land, TX (US); Mark T. Bernius, Midland, MI (US); Mohamed Esseghir, Lawrenceville, NJ (US); Robert L. McGee, Midland, MI (US); Michael H. Mazor, Midland, MI (US); John A. Naumovitz, Midland, MI (US)

(73) Assignee: Dow Global Technologies LLC, Midland, MI (US)

( * ) Notice: Subject to any disclaimer, the term of this patent is extended or adjusted under 35 U.S.C. 154(b) by 277 days.

This patent is subject to a terminal disclaimer.

(21) Appl. No.: 13/667,722

(22) Filed: Nov. 2, 2012

(65) Prior Publication Data

US 2013/0112270 A1    May 9, 2013

Related U.S. Application Data

(63) Continuation of application No. 11/857,195, filed on Sep. 18, 2007.

(60) Provisional application No. 60/826,319, filed on Sep. 20, 2006, provisional application No. 60/856,953, filed on Nov. 6, 2006.

(51) Int. Cl.
    C08F 210/02   (2006.01)
    H01L 31/048   (2014.01)
    B32B 17/10    (2006.01)

(52) U.S. Cl.
    CPC ......... *C08F 210/02* (2013.01); *B32B 17/10018* (2013.01); *B32B 17/10678* (2013.01); *B32B 17/10697* (2013.01); *H01L 31/048* (2013.01); *H01L 31/0481* (2013.01); *Y02E 10/50* (2013.01)

(58) Field of Classification Search
    None
    See application file for complete search history.

(56) References Cited

U.S. PATENT DOCUMENTS

| | | |
|---|---|---|
| 3,202,648 A | 8/1965 | Latourette et al. |
| 3,236,917 A | 2/1966 | Natta et al. |

(Continued)

FOREIGN PATENT DOCUMENTS

| | | |
|---|---|---|
| GB | 1 535 039 | 12/1978 |
| JP | 50-140867 A | 11/1975 |

(Continued)

OTHER PUBLICATIONS

ENGAGE 8100, Polyolefin Elastomer, The Dow Chemical Company.

(Continued)

*Primary Examiner* — Keith Walker
*Assistant Examiner* — Jacky Yuen
(74) *Attorney, Agent, or Firm* — Whyte Hirschboeck Dudek S.C.

(57) ABSTRACT

An electronic device module comprises:
  A. At least one electronic device, e.g., a solar cell, and
  B. A polymeric material in intimate contact with at least one surface of the electronic device, the polymeric material comprising an ethylene multi-block copolymer.

Typically, the polyolefin material is an ethylene multi-block copolymer with a density of less than about 0.90 grams per cubic centimeter (g/cc). The polymeric material can fully encapsulate the electronic device, or it can be laminated to one face surface of the device. Optionally, the polymeric material can further comprise a scorch inhibitor, and the copolymer can remain uncrosslinked or it can be crosslinked.

17 Claims, 3 Drawing Sheets

(56) References Cited

U.S. PATENT DOCUMENTS

| | | |
|---|---|---|
| 3,335,124 A | 8/1967 | Larsen |
| 3,751,378 A | 8/1973 | Cowperthwaite et al. |
| 3,862,107 A | 1/1975 | MacLeay |
| 3,954,907 A | 5/1976 | Schober |
| 4,129,531 A | 12/1978 | Rauer et al. |
| 4,632,950 A | 12/1986 | Kmiec et al. |
| 4,636,578 A * | 1/1987 | Feinberg ............ 136/251 |
| 4,950,541 A | 8/1990 | Tabor et al. |
| 5,194,509 A | 3/1993 | Hasenbein et al. |
| 5,266,627 A | 11/1993 | Meverden et al. |
| 5,741,370 A | 4/1998 | Hanoka |
| 5,986,203 A | 11/1999 | Hanoka et al. |
| 6,077,907 A | 6/2000 | Raetzsch et al. |
| 6,093,757 A | 7/2000 | Pern |
| 6,320,116 B1 | 11/2001 | Hanoka |
| 6,506,842 B1 | 1/2003 | Heck et al. |
| 6,586,271 B2 | 7/2003 | Hanoka |
| 2001/0045229 A1 | 11/2001 | Komori et al. |
| 2002/0038664 A1 | 4/2002 | Zenko et al. |
| 2004/0058162 A1* | 3/2004 | Tukachinsky et al. ...... 428/422 |
| 2006/0199006 A1 | 9/2006 | Poon et al. |
| 2006/0199030 A1 | 9/2006 | Liang et al. |
| 2006/0199744 A1 | 9/2006 | Walton et al. |
| 2006/0199872 A1 | 9/2006 | Prieto et al. |
| 2006/0199884 A1 | 9/2006 | Hoenig et al. |
| 2006/0199887 A1 | 9/2006 | Liang et al. |
| 2006/0199896 A1 | 9/2006 | Walton et al. |
| 2006/0199897 A1 | 9/2006 | Karjala et al. |
| 2006/0199905 A1 | 9/2006 | Hughes et al. |
| 2006/0199906 A1 | 9/2006 | Walton et al. |
| 2006/0199907 A1 | 9/2006 | Chang et al. |
| 2006/0199908 A1 | 9/2006 | Cheung et al. |
| 2006/0199910 A1 | 9/2006 | Walton et al. |
| 2006/0199911 A1 | 9/2006 | Markovich et al. |
| 2006/0199912 A1 | 9/2006 | Fuchs et al. |
| 2006/0199914 A1 | 9/2006 | Harris et al. |
| 2006/0199930 A1 | 9/2006 | Li Pi Shan et al. |
| 2006/0199931 A1 | 9/2006 | Poon et al. |
| 2006/0199983 A1 | 9/2006 | Kammerhofer et al. |
| 2008/0302417 A1 | 12/2008 | Inoue et al. |

FOREIGN PATENT DOCUMENTS

| | | | |
|---|---|---|---|
| JP | 59138447 A | * | 8/1984 |
| JP | 03052856 A | | 3/1991 |
| JP | 6-299125 A | | 10/1994 |
| JP | 2000-091611 A | | 3/2000 |
| JP | 2000-151046 A | | 5/2000 |
| JP | 2001044460 A | | 2/2001 |
| JP | 2001119047 A | | 4/2001 |
| JP | 2001326371 A | | 11/2001 |
| JP | 2002-513430 A | | 5/2002 |
| JP | 2003138034 A | | 5/2003 |
| JP | 2004-214641 A | | 7/2004 |
| WO | WO-9522844 A1 | | 8/1995 |
| WO | WO-95/33006 | | 12/1995 |
| WO | WO-9904971 A2 | | 2/1999 |
| WO | WO-9905206 A2 | | 2/1999 |
| WO | WO-2005/090427 A1 | | 9/2005 |

OTHER PUBLICATIONS

Potemkin, I.I., Physical Review E, Jun. 1998, pp. 6902-6912, vol. 57, No. 6.

Dobrynin, Andrey V., J. Chem. Phys., Dec. 1, 1997, pp. 9234-9238, vol. 107, No. 21.

Park, C.P., Handbook of Polymeric Foams and Foam Technology, 1991, pp. 198-204.

Kirk-Othmer, Encyclopedia of Chemical Technology, 1982, pp. 27-90, Third Edition, vol. 17.

PCT/ US2007/078845, International Search Report and the Written Opinion of the International Searching Authority.

PCT/ US2007/078845, International Preliminary Report on Patentability.

* cited by examiner

ELECTRONIC DEVICE MODULE COMPRISING AN ETHYLENE MULTI-BLOCK COPOLYMER

CROSS REFERENCE TO RELATED APPLICATION

The present application is a continuation application of the U.S. application Ser. No. 11/857,195, filed on Sep. 18, 2007, entitled "ELECTRONIC DEVICE MODULE COMPRISING AN ETHYLENE MULTI-BLOCK COPOLYMER," the teachings of which are incorporated by reference herein, as if reproduced in full hereinbelow, which claims priority from the U.S. Provisional Application No. 60/826,319, filed on Sep. 20, 2006 and from the U.S. Provisional Application No. 60/856,953, filed on Nov. 6, 2006, the teachings of which are incorporated by reference herein, as if reproduced in full hereinbelow.

FIELD OF THE INVENTION

This invention relates to electronic device modules. In one aspect, the invention relates to electronic device modules comprising an electronic device, e.g., a solar or photovoltaic (PV) cell, and a protective polymeric material while in another aspect, the invention relates to electronic device modules in which the protective polymeric material is an ethylene multi-block copolymer. In yet another aspect, the invention relates to a method of making an electronic device module.

BACKGROUND OF THE INVENTION

Polymeric materials are commonly used in the manufacture of modules comprising one or more electronic devices including, but not limited to, solar cells (also known as photovoltaic cells), liquid crystal panels, electro-luminescent devices and plasma display units. The modules often comprise an electronic device in combination with one or more substrates, e.g., one or more glass cover sheets, often positioned between two substrates in which one or both of the substrates comprise glass, metal, plastic, rubber or another material. The polymeric materials are typically used as the encapsulant or sealant for the module or depending upon the design of the module, as a skin layer component of the module, e.g., a backskin in a solar cell module. Typical polymeric materials for these purposes include silicone resins, epoxy resins, polyvinyl butyral resins, cellulose acetate, ethylene-vinyl acetate copolymer (EVA) and ionomers.

United States Patent Application Publication 2001/0045229 A1 identifies a number of properties desirable in any polymeric material that is intended for use in the construction of an electronic device module. These properties include (i) protecting the device from exposure to the outside environment, e.g., moisture and air, particularly over long periods of time (ii) protecting against mechanical shock, (iii) strong adhesion to the electronic device and substrates, (iv) easy processing, including sealing, (v) good transparency, particularly in applications in which light or other electromagnetic radiation is important, e.g., solar cell modules, (vi) short cure times with protection of the electronic device from mechanical stress resulting from polymer shrinkage during cure, (vii) high electrical resistance with little, if any, electrical conductance, and (viii) low cost. No one polymeric material delivers maximum performance on all of these properties in any particular application, and usually trade-offs are made to maximize the performance of properties most important to a particular application, e.g., transparency and protection against the environment, at the expense of properties secondary in importance to the application, e.g., cure time and cost. Combinations of polymeric materials are also employed, either as a blend or as separate components of the module.

EVA copolymers with a high content (28 to 35 wt %) of units derived from the vinyl acetate monomer are commonly used to make encapsulant film for use in photovoltaic (PV) modules. See, for example, WO 95/22844, 99/04971, 99/05206 and 2004/055908. EVA resins are typically stabilized with ultra-violet (UV) light additives, and they are typically crosslinked during the solar cell lamination process using peroxides to improve heat and creep resistance to a temperature between about 80 and 90 C. However, EVA resins are less than ideal PV cell encapsulating film material for several reasons. For example, EVA film progressively darkens in intense sunlight due to the EVA resin chemically degrading under the influence of UV light. This discoloration can result in a greater than 30% loss in power output of the solar module after as little as four years of exposure to the environment. EVA resins also absorb moisture and are subject to decomposition.

Moreover and as noted above, EVA resins are typically stabilized with UV additives and crosslinked during the solar cell lamination and/or encapsulation process using peroxides to improve heat resistance and creep at high temperature, e.g., 80 to 90° C. However, because of the C=O bonds in the EVA molecular structure that absorbs UV radiation and the presence of residual peroxide crosslinking agent in the system after curing, an additive package is used to stabilize the EVA against UV-induced degradation. The residual peroxide is believed to be the primary oxidizing reagent responsible for the generation of chromophores (e.g., U.S. Pat. No. 6,093,757). Additives such as antioxidants, UV-stabilizers, UV-absorbers and others are can stabilize the EVA, but at the same time the additive package can also block UV-wavelengths below 360 nanometers (nm).

Photovoltaic module efficiency depends on photovoltaic cell efficiency and the sun light wavelength passing through the encapsulant. One of the most fundamental limitations on the efficiency of a solar cell is the band gap of its semi-conducting material, i.e., the energy required to boost an electron from the bound valence band into the mobile conduction band. Photons with less energy than the band gap pass through the module without being absorbed. Photons with energy higher than the band gap are absorbed, but their excess energy is wasted (dissipated as heat). In order to increase the photovoltaic cell efficiency, "tandem" cells or multi-junction cells are used to broaden the wavelength range for energy conversion. In addition, in many of the thin film technologies such as amorphous silicon, cadmium telluride, or copper indium gallium selenide, the band gap of the semi-conductive materials is different than that of mono-crystalline silicon. These photovoltaic cells will convert light into electricity for wavelength below 360 nm. For these photovoltaic cells, an encapsulant that can absorb wavelengths below 360 nm is needed to maintain the PV module efficiency.

U.S. Pat. Nos. 6,320,116 and 6,586,271 teach another important property of these polymeric materials, particularly those materials used in the construction of solar cell modules. This property is thermal creep resistance, i.e., resistance to the permanent deformation of a polymer over a period of time as a result of temperature. Thermal creep resistance, generally, is directly proportional to the melting temperature of a polymer. Solar cell modules designed for use in architectural application often need to show excellent resistance to thermal creep at temperatures of 90 C or higher. For materials with low melting temperatures, e.g., EVA, crosslinking the polymeric material is often necessary to give it higher thermal creep resistance.

Crosslinking, particularly chemical crosslinking, while addressing one problem, e.g., thermal creep, can create other problems. For example, EVA, a common polymeric material used in the construction of solar cell modules and which has a rather low melting point, is often crosslinked using an organic peroxide initiator. While this addresses the thermal creep problem, it creates a corrosion problem, i.e., total crosslinking is seldom, if ever, fully achieved and this leaves residual peroxide in the EVA. This remaining peroxide can promote oxidation and degradation of the EVA polymer and/or electronic device, e.g., through the release of acetic acid over the life of the electronic device module. Moreover, the addition of organic peroxide to EVA requires careful temperature control to avoid premature crosslinking.

Another potential problem with peroxide-initiated crosslinking is the buildup of crosslinked material on the metal surfaces of the process equipment. During extrusion runs, high residence time is experienced at all metal flow surfaces. Over longer periods of extrusion time, crosslinked material can form at the metal surfaces and require cleaning of the equipment. The current practice to minimize gel formation, i.e., this crosslinking of polymer on the metal surfaces of the processing equipment, is to use low processing temperatures which, in turn, reduces the production rate of the extruded product.

One other property that can be important in the selection of a polymeric material for use in the manufacture of an electronic device module is thermoplasticity, i.e., the ability to be softened, molded and formed. For example, if the polymeric material is to be used as a backskin layer in a frameless module, then it should exhibit thermoplasticity during lamination as described in U.S. Pat. No. 5,741,370. This thermoplasticity, however, must not be obtained at the expense of effective thermal creep resistance.

SUMMARY OF THE INVENTION

In one embodiment, the invention is an electronic device module comprising:

A. At least one electronic device, and
B. A polymeric material in intimate contact with at least one surface of the electronic device, the polymeric material comprising (i) an ethylene multi-block copolymer, (ii) optionally, free radical initiator, e.g., a peroxide or azo compound, or a photoinitiator, e.g., benzophenone, in an amount of at least about 0.05 wt % based on the weight of the copolymer, and (iii) optionally, a co-agent in an amount of at least about 0.05 wt % based upon the weight of the copolymer.

In another embodiment, the invention is an electronic device module comprising:

A. At least one electronic device, and
B. An polymeric material in intimate contact with at least one surface of the electronic device, the polymeric material comprising (i) an ethylene multi-block copolymer, and (ii) a vinyl silane, e.g., vinyl tri-ethoxy silane or vinyl tri-methoxy silane, in an amount of at least about 0.1 wt % based on the weight of the copolymer, (iii) a free radical initiator, e.g., a peroxide or azo compound, or a photoinitiator, e.g., benzophenone, in an amount of at least about 0.05 wt % based on the weight of the copolymer, and (iv) optionally, a co-agent in an amount of at least about 0.05 wt % based on the weight of the copolymer.

"In intimate contact" and like terms mean that the polymeric material is in contact with at least one surface of the device or other article in a similar manner as a coating is in contact with a substrate, e.g., little, if any gaps or spaces between the polymeric material and the face of the device and with the material exhibiting good to excellent adhesion to the face of the device. After extrusion or other method of applying the polymeric material to at least one surface of the electronic device, the material typically forms and/or cures to a film that can be either transparent or opaque and either flexible or rigid. If the electronic device is a solar cell or other device that requires unobstructed or minimally obstructed access to sunlight or to allow a user to read information from it, e.g., a plasma display unit, then that part of the material that covers the active or "business" surface of the device is highly transparent.

The module can further comprise one or more other components, such as one or more glass cover sheets, and in these embodiments, the polymeric material usually is located between the electronic device and the glass cover sheet in a sandwich configuration. If the polymeric material is applied as a film to the surface of the glass cover sheet opposite the electronic device, then the surface of the film that is in contact with that surface of the glass cover sheet can be smooth or uneven, e.g., embossed or textured.

Typically, the ethylene multi-block copolymer is an ethylene/∀-olefin copolymer with (a) a molecular fraction that elutes between about 40 C and about 130 C when fractionated using temperature rising effluent fractionation (TREF), characterized in that the fraction has a block index of at least 0.5 and up to about 1 and a molecular weight distribution (PDI, Mw/Mn, MWD) greater than about 1.3, or (b) an average block index greater than zero and up to about 1.0 and an MWD greater than about 1.3. In addition, the ethylene multi-block copolymer typically has at least one of the following properties: (i) a molecular weight distribution of greater than about 1.3, (ii) a density of less than about 0.90 g/cc, (iii) a 2% secant modulus of less than about 150 megaPascal (mPa) as measured by ASTM D-882-02, (iv) a melt point of less than about 125 C, (v) an ∀-olefin content of at least about 10 and less than about 80 wt % based on the weight of the copolymer, (vi) a Tg of less than about −35 C, and (vii) a melt index (MI) of less than about 100 grams per 10 minutes (g/10 min). The polymeric material can fully encapsulate the electronic device, or it can be in intimate contact with only a portion of it, e.g., partially encapsulates the device or is laminated to one face surface of the device. In addition, at least one additional film can be interposed between the polymeric material and the electronic device. Optionally, the polymeric material can further comprise a scorch inhibitor, and depending upon the application for which the module is intended, the chemical composition of the copolymer and other factors, the copolymer can remain uncrosslinked or be crosslinked. If crosslinked, then it is crosslinked such that it contains less than about 70 percent xylene soluble extractables as measured by ASTM 2765-95.

In another embodiment, the invention is the electronic device module as described in the two embodiments above except that the polymeric material in intimate contact with at least one surface of the electronic device is a co-extruded material in which at least one outer skin layer (i) does not contain peroxide for crosslinking, and (ii) is the surface which comes into intimate contact with the module. Typically, this outer skin layer exhibits good adhesion to glass. This outer skin of the co-extruded material can comprise any one of a number of different polymers, but is typically the same polymer as the polymer of the peroxide-containing layer but without the peroxide. This embodiment of the invention allows for the use of higher processing temperatures which, in turn, allows for faster production rates without unwanted gel formation in the encapsulating polymer due to extended contact with the metal surfaces of the processing equipment. In another embodiment, the extruded product comprises at least three layers in which the skin layer in contact with the electronic module is without peroxide, and the peroxide-containing layer is a core layer.

In another embodiment, the invention is a method of manufacturing an electronic device module, the method comprising the steps of:
  A. Providing at least one electronic device, and
  B. Contacting at least one surface of the electronic device with a polymeric material comprising (i) an ethylene multi-block copolymer, (ii) optionally, a free radical initiator, e.g., a peroxide or azo compound, or a photo-initiator, e.g., benzophenone, in an amount of at least about 0.05 wt % based on the weight of the copolymer, and (iii) optionally, a co-agent in an amount of at least about 0.05 wt % based upon the weight of the copolymer.

In another embodiment the invention is a method of manufacturing an electronic device, the method comprising the steps of:
  A. Providing at least one electronic device, and
  B. Contacting at least one surface of the electronic device with a polymeric material comprising (i) an ethylene multi-block copolymer, (ii) a vinyl silane, e.g., vinyl tri-ethoxy silane or vinyl tri-methoxy silane, in an amount of at least about 0.1 wt % based on the weight of the copolymer, (iii) a free radical initiator, e.g., a peroxide or azo compound, or a photoinitiator, e.g., benzophenone, in an amount of at least about 0.05 wt % based on the weight of the copolymer, and (iv) optionally, a co-agent in an amount of at least about 0.05 wt % based on the weight of the copolymer.

In a variant on both of these two method embodiments, the module further comprises at least one translucent cover layer disposed apart from one face surface of the device, and the polymeric material is interposed in a sealing relationship between the electronic device and the cover layer. The cover layer can be rigid, e.g., glass, or flexible, e.g., a polymeric film. "In a sealing relationship" and like terms mean that the polymeric material adheres well to both the cover layer and the electronic device, typically to at least one face surface of each, and that it binds the two together with little, if any, gaps or spaces between the two module components (other than any gaps or spaces that may exist between the polymeric material and the cover layer as a result of the polymeric material applied to the cover layer in the form of an embossed or textured film, or the cover layer itself is embossed or otherwise textured).

Moreover, in both of these method embodiments, the polymeric material can further comprise a scorch inhibitor, and the method can optionally include a step in which the copolymer is crosslinked, e.g., either contacting the electronic device and/or glass cover sheet with the polymeric material under crosslinking conditions, or exposing the module to crosslinking conditions after the module is formed such that the polyolefin copolymer contains less than about 70 percent xylene soluble extractables as measured by ASTM 2765-95. Crosslinking conditions include heat (e.g., a temperature of at least about 160 C), radiation (e.g., at least about 15 mega-rad if by E-beam, or 0.05 joules/cm$^2$ if by UV light), moisture (e.g., a relative humidity of at least about 50%), etc.

In another variant on these method embodiments, the electronic device is encapsulated, i.e., fully engulfed or enclosed, within the polymeric material. In another variant on these embodiments, the cover layer is treated with a silane coupling agent, e.g., (-amino propyl tri-ethoxy silane. In yet another variant on these embodiments, the polymeric material further comprises a graft polymer to enhance its adhesive property relative to the one or both of the electronic device and cover layer. Typically the graft polymer is made in situ simply by grafting the ethylene multi-block copolymer with an unsaturated organic compound that contains a carbonyl group, e.g., maleic anhydride.

DESCRIPTION OF THE PREFERRED EMBODIMENTS

Figure 1:
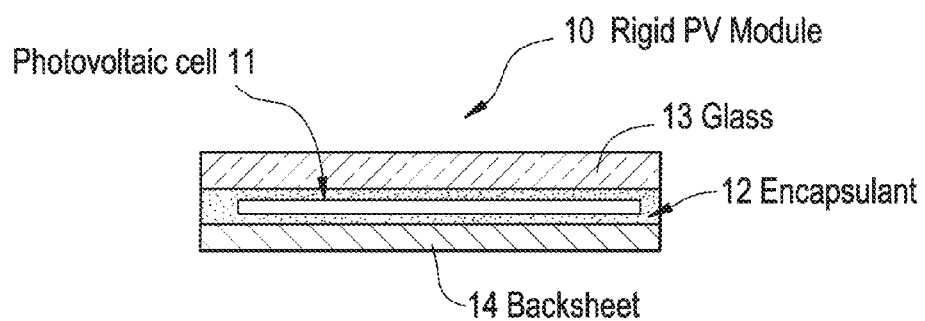
FIG. 1 is a schematic of one embodiment of an electronic device module of this invention, i.e., a rigid photovoltaic (PV) module.

The term "polymer", includes both conventional homopolymers, that is, homogeneous polymers prepared from a single monomer, and copolymers (interchangeably referred to as interpolymers), meaning polymers prepared by reaction of at least two monomers or otherwise containing chemically differentiated segments or blocks even if formed from a single monomer. More specifically, the term "polyethylene" includes homopolymers of ethylene and copolymers of ethylene and one or more $C_{3-8}$ ∀-olefins in which ethylene comprises at least 50 mole percent. The term "crystalline" if employed, refers to a polymer that possesses a first order transition or crystalline melting point (Tm) as determined by differential scanning calorimetry (DSC) or equivalent technique. The term may be used interchangeably with the term "semicrystalline". The term "amorphous" refers to a polymer lacking a crystalline melting point as determined by DSC or equivalent technique.

"Multi-block copolymer", "segmented copolymer" and like terms refer to a polymer comprising two or more chemically distinct regions or segments (referred to as "blocks") preferably joined in a linear manner, that is, a polymer comprising chemically differentiated units which are joined end-to-end with respect to polymerized ethylenic functionality, rather than in pendent or grafted fashion. In a preferred embodiment, the blocks differ in the amount or type of incorporated comonomer, density, amount of crystallinity, crystallite size attributable to a polymer of such composition, type or degree of tacticity (isotactic or syndiotactic), regio-regularity or regio-irregularity, amount of branching (including long chain branching or hyper-branching), homogeneity or any other chemical or physical property. Compared to block copolymers of the prior art, including copolymers produced by sequential monomer addition, fluxional catalysts, or anionic polymerization techniques, the multi-block copolymers used in the practice of this invention are characterized by unique distributions of both polymer polydispersity (PDI or Mw/Mn or MWD), block length distribution, and/or block number distribution, due, in a preferred embodiment, to the effect of the shuttling agent(s) in combination with multiple catalysts used in their preparation. More specifically, when produced in a continuous process, the polymers desirably possess PDI from 1.7 to 3.5, preferably from 1.8 to 3, more preferably from 1.8 to 2.5, and most preferably from 1.8 to 2.2. When produced in a batch or semi-batch process, the polymers desirably possess PDI from 1.0 to 3.5, preferably from 1.3 to 3, more preferably from 1.4 to 2.5, and most preferably from 1.4 to 2.

The term "ethylene multi-block copolymer" means a multi-block copolymer comprising ethylene and one or more copolymerizable comonomers, in which ethylene comprises a plurality of the polymerized monomer units of at least one block or segment in the polymer, preferably at least 90, more preferably at least 95 and most preferably at least 98, mole percent of the block. Based on total polymer weight, the ethylene multi-block copolymers used in the practice of the present invention preferably have an ethylene content from 25 to 97, more preferably from 40 to 96, even more preferably from 55 to 95 and most preferably from 65 to 85, percent.

Because the respective distinguishable segments or blocks formed from two of more monomers are joined into single polymer chains, the polymer cannot be completely fractionated using standard selective extraction techniques. For example, polymers containing regions that are relatively crystalline (high density segments) and regions that are relatively amorphous (lower density segments) cannot be selectively extracted or fractionated using differing solvents. In a preferred embodiment the quantity of extractable polymer using either a dialkyl ether or an alkane-solvent is less than 10, preferably less than 7, more preferably less than 5 and most preferably less than 2, percent of the total polymer weight.

In addition, the multi-block copolymers used in the practice of the invention desirably possess a PDI fitting a Schutz-Flory distribution rather than a Poisson distribution. The use of the polymerization process described in WO 2005/090427 and U.S. Ser. No. 11/376,835 results in a product having both a polydisperse block distribution as well as a polydisperse distribution of block sizes. This results in the formation of polymer products having improved and distinguishable physical properties. The theoretical benefits of a polydisperse block distribution have been previously modeled and discussed in Potemkin, *Physical Review E* (1998) 57 (6), pp. 6902-6912, and Dobrynin, *J. Chem. Phys.* (1997) 107 (21), pp 9234-9238.

In a further embodiment, the polymers of the invention, especially those made in a continuous, solution polymerization reactor, possess a most probable distribution of block lengths. The most preferred polymers used in the practice of this invention are multi-block copolymers containing 4 or more blocks or segments including terminal blocks. In one embodiment of this invention, the ethylene multi-block copolymers are defined as having:

(a) a Mw/Mn from about 1.7 to about 3.5, at least one melting point, Tm, in degrees Celsius, and a density, d, in grams/cubic centimeter, where in the numerical values of Tm and d correspond to the relationship $Tm > -2002.9 + 4538.5(d) - 2422.2(d)^2$, or (b) a Mw/Mn from about 1.7 to about 3.5, and is characterized by a heat of fusion, $\Delta H$ in J/g, and a delta quantity, $\Delta T$, in degrees Celsius defined as the temperature difference between the tallest DSC peak and the tallest CRYSTAF peak, wherein the numerical values of $\Delta T$ and $\Delta H$ have the following relationships:

$\Delta T > -0.1299(\Delta H) + 62.81$ for $\Delta H$ greater than zero and up to 130 J/g)

$\Delta T \geq 48$ C for $\Delta H$ greater than 130 J/g wherein the CRYSTAF peak is determined using at least 5 percent of the cumulative polymer, and if less than 5 percent of the polymer has an identifiable CRYSTAF peak, then the CRYSTAF temperature is 30 C; or (c) an elastic recovery, Re, in percent at 300 percent strain and 1 cycle measured with a compression-molded film of the ethylene/$\alpha$-olefin interpolymer, and has a density, d, in grams/cubic centimeter, wherein the numerical values of Re and d satisfy the following relationship when ethylene/$\alpha$-olefin interpolymer is substantially free of crosslinked phase:

$Re > 1481 - 1629(d)$; or (d) has a molecular weight fraction which elutes between 40 C and 130 C when fractionated using TREF, characterized in that the fraction has a molar comonomer content of at least 5 percent higher than that of a comparable random ethylene interpolymer fraction eluting between the same temperatures, wherein said comparable random ethylene interpolymer has the same comonomer(s) and has a melt index, density and molar comonomer content (based on the whole polymer) within 10 percent of that of the ethylene/$\alpha$-olefin interpolymer; or (e) has a storage modulus at 25 C, G' (25 C), and a storage modulus at 100 C, G' (100 C), wherein the ratio of G' (25 C) to G' (100 C) is in the range of about 1:1 to about 9:1.

The ethylene/$\alpha$-olefin interpolymer may also have:

(a) a molecular fraction which elutes between 40 C and 130 C when fractionated using TREF, characterized in that the fraction has a block index of at least 0.5 and up to about 1 and a molecular weight distribution, Mw/Mn, greater than about 1.3; or (b) an average block index greater than zero and up to about 1.0 and a molecular weight distribution, Mw/Mn greater than about 1.3.

Figure 3:
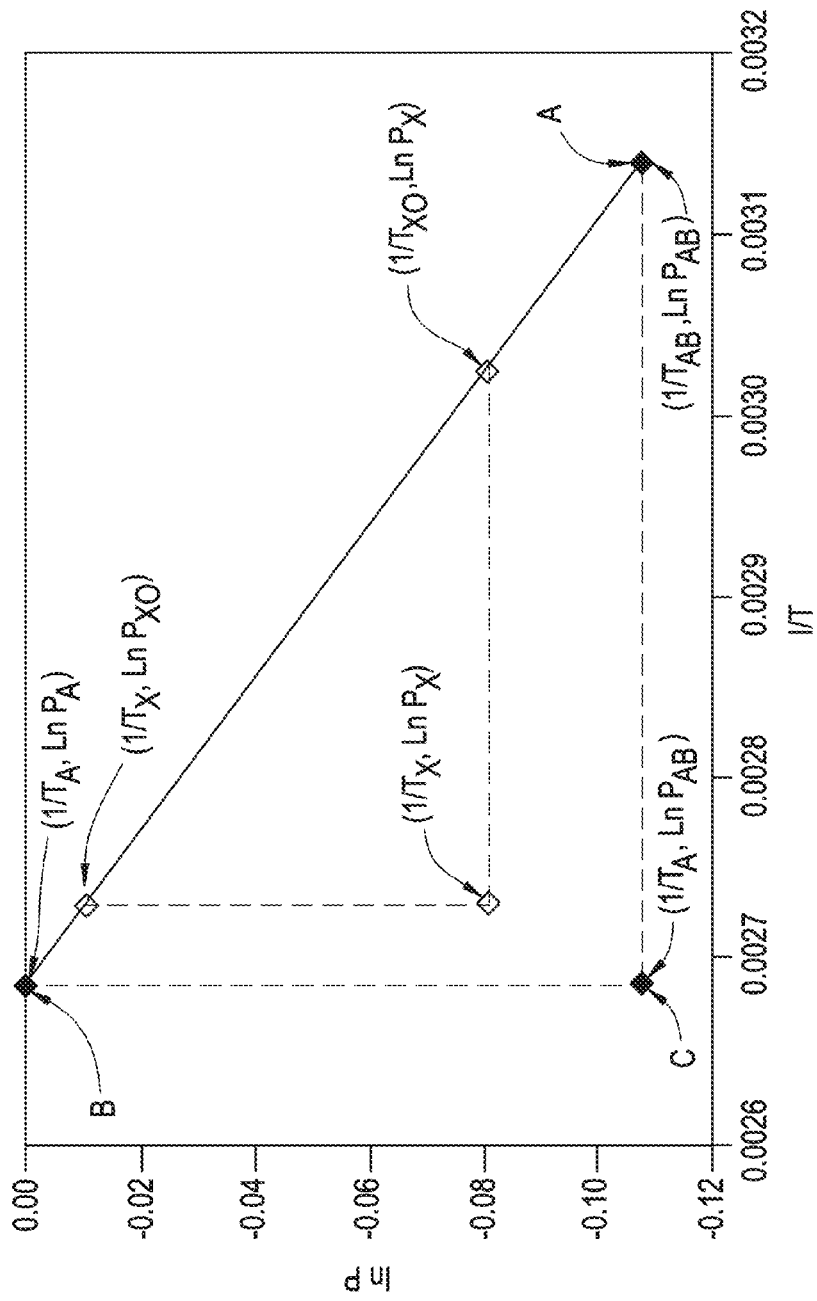
FIG. 3 is a plot constructed on the basis of the Flory equation for random ethylene/α-olefin copolymers to illustrate the definition of "block index." "A" represents the whole, perfect random copolymer; "B" represents a pure "hard segment"; and "C" represents the whole, perfect block copolymer having the same comonomer content as "A". A, B, and C define a triangular area within which most TREF fractions would fall.

The ethylene/$\alpha$-olefin interpolymers are characterized by an average block index, ABI, which is greater than zero and up to about 1.0 and a molecular weight distribution, $M_w/M_n$, greater than about 1.3. The average block index, ABI, is the weight average of the block index ("BI") for each of the polymer fractions obtained in preparative TREF (i.e., fractionation of a polymer by Temperature Rising Elution Fractionation) from 20° C. and 110° C., with an increment of 5° C. (although other temperature increments, such as 1° C., 2° C., 10° C., also can be used):

$ABI = \Sigma(w_i BI_i)$ where $BI_i$ is the block index for the ith fraction of the inventive ethylene/$\alpha$-olefin interpolymer obtained in preparative TREF, and $w_i$ is the weight percentage of the ith fraction. Similarly, the square root of the second moment about the mean, hereinafter referred to as the second moment weight average block index, can be defined as follows.

$$2^{nd} \text{ moment weight average } BI = \sqrt{\frac{\sum(w_i(BI_i - ABI)^2)}{\frac{(N-1)\sum w_i}{N}}}$$

where N is defined as the number of fractions with $BI_i$ greater than zero. Referring to FIG. 3, for each polymer fraction, BI is defined by one of the two following equations (both of which give the same BI value):

$$BI = \frac{1/T_X - 1/T_{XO}}{1/T_A - 1/T_{AB}} \text{ or } BI = -\frac{LnP_X - LnP_{XO}}{LnP_A - LnP_{AB}}$$

where $T_X$ is the ATREF (i.e., analytical TREF) elution temperature for the ith fraction (preferably expressed in Kelvin), $P_X$ is the ethylene mole fraction for the ith fraction, which can be measured by NMR or IR as described below. $P_{AB}$ is the ethylene mole fraction of the whole ethylene/α-olefin interpolymer (before fractionation), which also can be measured by NMR or IR. $T_A$ and $P_A$ are the ATREF elution temperature and the ethylene mole fraction for pure "hard segments" (which refer to the crystalline segments of the interpolymer). As an approximation or for polymers where the "hard segment" composition is unknown, the $T_A$ and $P_A$ values are set to those for high density polyethylene homopolymer.

Figure 4:
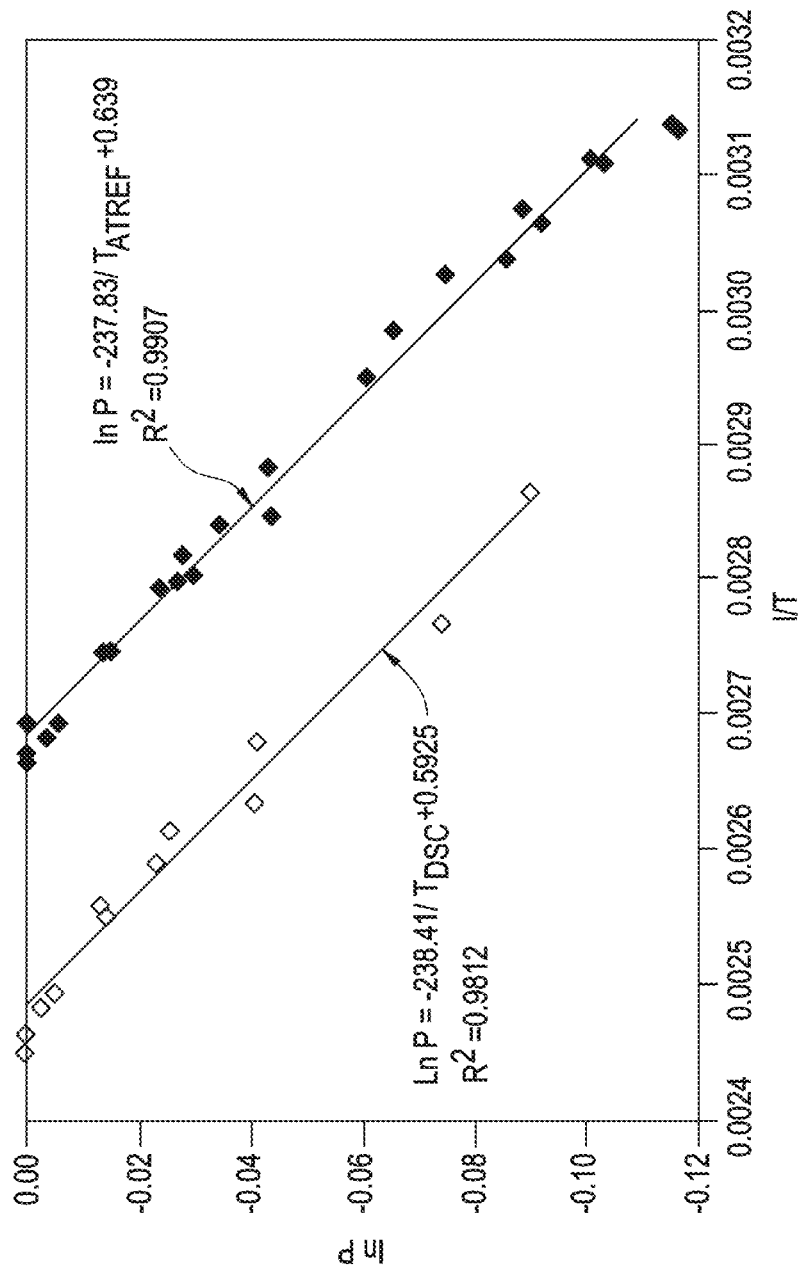
FIG. 4 is plot of natural log ethylene mole fraction for random ethylene/α-olefin copolymers as a function of the inverse of DSC peak melting temperature or ATREF peak temperature. The filled squares represent data points obtained from random homogeneously branched ethylene/α-olefin copolymers in ATREF; and the open squares represent data points obtained from random homogeneously branched ethylene/α-olefin copolymers in DSC. "P" is the ethylene mole fraction; "T" is the temperature in Kelvin.

$T_{AB}$ is the ATREF elution temperature for a random copolymer of the same composition (having an ethylene mole fraction of $P_{AB}$) and molecular weight as the inventive copolymer. $T_{AB}$ can be calculated from the mole fraction of ethylene (measured by NMR) using the following equation:

$$LnP_{AB} = \alpha/T_{AB} + \beta$$

where α and β are two constants which can be determined by a calibration using a number of well characterized preparative TREF fractions of a broad composition random copolymer and/or well characterized random ethylene copolymers with narrow composition. It should be noted that α and β may vary from instrument to instrument. Moreover, one would need to create an appropriate calibration curve with the polymer composition of interest, using appropriate molecular weight ranges and comonomer type for the preparative TREF fractions and/or random copolymers used to create the calibration. There is a slight molecular weight effect. If the calibration curve is obtained from similar molecular weight ranges, such effect would be essentially negligible. In some embodiments as illustrated in FIG. 4, random ethylene copolymers and/or preparative TREF fractions of random copolymers satisfy the following relationship:

$$LnP = -237.83/T_{ATREF} + 0.639$$

The above calibration equation relates the mole fraction of ethylene, P, to the analytical TREF elution temperature, $T_{ATREF}$, for narrow composition random copolymers and/or preparative TREF fractions of broad composition random copolymers. $T_{XO}$ is the ATREF temperature for a random copolymer of the same composition (i.e., the same comonomer type and content) and the same molecular weight and having an ethylene mole fraction of $P_X$. $T_{XO}$ can be calculated from $LnP_X = \alpha/T_{XO} + \beta$ from a measured $P_X$ mole fraction. Conversely, $P_{XO}$ is the ethylene mole fraction for a random copolymer of the same composition (i.e., the same comonomer type and content) and the same molecular weight and having an ATREF temperature of $T_X$, which can be calculated from $Ln P_{XO} = \alpha/T_X + \beta$ using a measured value of $T_X$.

Once the block index (BI) for each preparative TREF fraction is obtained, the weight average block index, ABI, for the whole polymer can be calculated.

Suitable monomers for use in preparing the ethylene multi-block copolymers used in the practice of this present invention include ethylene and one or more addition polymerizable monomers other than ethylene. Examples of suitable comonomers include straight-chain or branched ∀-olefins of 3 to 30, preferably 3 to 20, carbon atoms, such as propylene, 1-butene, 1-pentene, 3-methyl-1-butene, 1-hexene, 4-methyl-1-pentene, 3-methyl-1-pentene, 1-octene, 1-decene, 1-dodecene, 1-tetradecene, 1-hexadecene, 1-octadecene and 1-eicosene; cyclo-olefins of 3 to 30, preferably 3 to 20, carbon atoms, such as cyclopentene, cycloheptene, norbornene, 5-methyl-2-norbornene, tetracyclododecene, and 2-methyl-1,4,5,8-dimethano-1,2,3,4,4a,5,8,8a-octahydronaphthalene; di- and polyolefins, such as butadiene, isoprene, 4-methyl-1,3-pentadiene, 1,3-pentadiene, 1,4-pentadiene, 1,5-hexadiene, 1,4-hexadiene, 1,3-hexadiene, 1,3-octadiene, 1,4-octadiene, 1,5-octadiene, 1,6-octadiene, 1,7-octadiene, ethylidenenorbornene, vinyl norbornene, dicyclopentadiene, 7-methyl-1,6-octadiene, 4-ethylidene-8-methyl-1,7-nonadiene, and 5,9-dimethyl-1,4,8-decatriene; aromatic vinyl compounds such as mono- or poly alkylstyrenes (including styrene, o-methylstyrene, m-methylstyrene, p-methylstyrene, o,p-dimethylstyrene, o-ethylstyrene, m-ethylstyrene and p-ethylstyrene), and functional group-containing derivatives, such as methoxystyrene, ethoxystyrene, vinyl benzoic acid, methyl vinyl benzoate, vinylbenzyl acetate, hydroxystyrene, o-chlorostyrene, p-chlorostyrene, divinylbenzene, 3-phenylpropene, 4-phenylpropene, a-methylstyrene, vinyl chloride, 1,2-difluoroethylene, 1,2-dichloroethylene, tetrafluoroethylene, and 3,3,3-trifluoro-1-propene.

Other ethylene multi-block copolymers that can be used in the practice of this invention are elastomeric interpolymers of ethylene, a $C_{3-20}$ ∀-olefin, especially propylene, and, optionally, one or more diene monomers. Preferred ∀-olefins for use in this embodiment of the present invention are designated by the formula $CH_2$=CHR*, where R* is a linear or branched alkyl group of from 1 to 12 carbon atoms. Examples of suitable ∀-olefins include, but are not limited to, propylene, isobutylene, 1-butene, 1-pentene, 1-hexene, 4-methyl-1-pentene, and 1-octene. One particularly preferred ∀-olefin is propylene. The propylene based polymers are generally referred to in the art as EP or EPDM polymers. Suitable dienes for use in preparing such polymers, especially multi-block EPDM type-polymers include conjugated or non-conjugated, straight or branched chain-, cyclic- or polycyclic dienes containing from 4 to 20 carbon atoms. Preferred dienes include 1,4-pentadiene, 1,4-hexadiene, 5-ethylidene-2-norbornene, dicyclopentadiene, cyclohexadiene, and 5-butylidene-2-norbornene. One particularly preferred diene is 5-ethylidene-2-norbornene.

Because the diene containing polymers contain alternating segments or blocks containing greater or lesser quantities of the diene (including none) and ∀-olefin (including none), the total quantity of diene and ∀-olefin may be reduced without loss of subsequent polymer properties. That is, because the diene and ∀-olefin monomers are preferentially incorporated into one type of block of the polymer rather than uniformly or randomly throughout the polymer, they are more efficiently utilized and subsequently the crosslink density of the polymer can be better controlled. Such crosslinkable elastomers and the cured products have advantaged properties, including higher tensile strength and better elastic recovery.

Desirably, the ethylene multi-block copolymers are made with two catalysts incorporating differing quantities of comonomer, and these copolymers have a weight ratio of blocks from 95:5 to 5:95. The elastomeric polymers desirably have an ethylene content of from 20 to 90 percent, optionally a diene content of from 0.1 to 10 percent, and an ∀-olefin content of from 10 to 80 percent, based on the total weight of the polymer. Further preferably, the multi-block elastomeric polymers of this embodiment have an ethylene content of from 60 to 90 percent, a diene content of from 0.1 to 10 percent, and an ∀-olefin content of from 10 to 40 percent, based on the total weight of the polymer. Preferred polymers are high molecular weight polymers, having a weight average molecular weight (Mw) from 10,000 to about 2,500,000, preferably from 20,000 to 500,000, more preferably from 20,000 to 350,000; a polydispersity less than 3.5, more preferably less than 3.0; and a Mooney viscosity (ML (1+4)125 C.) from 1 to 250. More preferably, such polymers have an ethylene content from 65 to 75 percent, a diene content from 0 to 6 percent, and an ∀-olefin content from 20 to 35 percent.

The ethylene multi-block copolymers useful in the practice of this invention have a density of less than about 0.90, preferably less than about 0.89, more preferably less than about 0.885, even more preferably less than about 0.88 and even more preferably less than about 0.875, g/cc. The ethylene multi-block copolymers typically have a density greater than about 0.85, and more preferably greater than about 0.86 g/cc. Density is measured by the procedure of ASTM D-792. Low density ethylene multi-block copolymers are generally characterized as amorphous, flexible and having good optical properties, e.g., high transmission of visible and UV-light and low haze.

The ethylene multi-block copolymers useful in the practice of this invention have a 2% secant modulus of less than about 150, preferably less than about 140, more preferably less than about 120 and even more preferably less than about 100, mPa as measured by the procedure of ASTM D-882-02. The ethylene multi-block copolymers typically have a 2% secant modulus of greater than zero, but the lower the modulus, the better the copolymer is adapted for use in this invention. The secant modulus is the slope of a line from the origin of a stress-strain diagram and intersecting the curve at a point of interest, and it is used to describe the stiffness of a material in the inelastic region of the diagram. Low modulus ethylene multi-block copolymers are particularly well adapted for use in this invention because they provide stability under stress, e.g., less prone to crack upon stress or shrinkage.

The ethylene multi-block copolymers useful in the practice of this invention typically have a melting point of less than about 125. The melting point is measured by the differential scanning calorimetry (DSC) method described in WO 2005/090427 (US2006/0199930). Ethylene multi-block copolymers with a low melting point often exhibit desirable flexibility and thermoplasticity properties useful in the fabrication of the modules of this invention.

The ethylene multi-block copolymers used in the practice of this invention, and their preparation and use, are more fully described in WO 2005/090427, US2006/0199931, US2006/0199930, US2006/0199914, US2006/0199912, US2006/0199911, US2006/0199910, US2006/0199908, US2006/0199907, US2006/0199906, US2006/0199905, US2006/0199897, US2006/0199896, US2006/0199887, US2006/0199884, US2006/0199872, US2006/0199744, US2006/0199030, US2006/0199006 and US2006/0199983.

Due to the unique compositional structure of the ethylene multi-block copolymers used in the practice of this invention, these materials often do not require crosslinking to achieve the desired properties of a protective polymer component in an electronic device module, particularly with respect to thermal creep and modulus. In those circumstances in which the ethylene multi-block copolymer has a particularly low density, e.g., less than about 0.86 g/cc, or melting point, e.g., less than about 120 C, then these copolymers are typically cured or crosslinked at the time of contact or after, usually shortly after, the module has been constructed. For low density and/or low modulus polymers, crosslinking is important to the performance of their function to protect the electronic device from the environment. Specifically, crosslinking enhances the thermal creep resistance of such polymers and the durability of the module in terms of heat, impact and solvent resistance. If crosslinking is desired, then it can be effected by any one of a number of different methods, e.g., by the use of thermally activated initiators, e.g., peroxides and azo compounds; photoinitiators, e.g., benzophenone; radiation techniques other than sunlight and UV light, e.g., E-beam and x-ray; vinyl silane, e.g., vinyl tri-ethoxy or vinyl tri-methoxy silane; and moisture cure.

The free radical initiators used in the practice of this invention include any thermally activated compound that is relatively unstable and easily breaks into at least two radicals. Representative of this class of compounds are the peroxides, particularly the organic peroxides, and the azo initiators. Of the free radical initiators used as crosslinking agents, the dialkyl peroxides and diperoxyketal initiators are preferred. These compounds are described in the Encyclopedia of Chemical Technology, 3rd edition, Vol. 17, pp 27-90. (1982).

In the group of dialkyl peroxides, the preferred initiators are: dicumyl peroxide, di-t-butyl peroxide, t-butyl cumyl peroxide, 2,5-dimethyl-2,5-di(t-butylperoxy)-hexane, 2,5-dimethyl-2,5-di(t-amylperoxy)-hexane, 2,5-dimethyl-2,5-di(t-butylperoxy)hexyne-3,2,5-dimethyl-2,5-di(t-amylperoxy) hexyne-3, ∀,∀-di[(t-butylperoxy)-isopropyl]-benzene, di-t-amyl peroxide, 1,3,5-tri-[(t-butylperoxy)-isopropyl]benzene, 1,3-dimethyl-3-(t-butylperoxy)butanol, 1,3-dimethyl-3-(t-amylperoxy)butanol and mixtures of two or more of these initiators.

In the group of diperoxyketal initiators, the preferred initiators are: 1,1-di(t-butylperoxy)-3,3,5-trimethylcyclohexane, 1,1-di(t-butylperoxy)cyclohexane n-butyl, 4,4-di(t-amylperoxy)valerate, ethyl 3,3-di(t-butylperoxy)butyrate, 2,2-di(t-amylperoxy)propane, 3,6,6,9,9-pentamethyl-3-ethoxycarbonylmethyl-1,2,4,5-tetraoxacyclononane, n-butyl-4,4-bis(t-butylperoxy)-valerate, ethyl-3,3-di(t-amylperoxy)-butyrate and mixtures of two or more of these initiators.

Other peroxide initiators, e.g., 00-t-butyl-0-hydrogen-monoperoxysuccinate; 00-t-amyl-0-hydrogen-monoperoxysuccinate and/or azo initiators e.g., 2,2'-azobis-(2-acetoxypropane), may also be used to provide a crosslinked polymer matrix. Other suitable azo compounds include those described in U.S. Pat. Nos. 3,862,107 and 4,129,531. Mixtures of two or more free radical initiators may also be used together as the initiator within the scope of this invention. In addition, free radicals can form from shear energy, heat or radiation.

The amount of peroxide or azo initiator present in the crosslinkable compositions of this invention can vary widely, but the minimum amount is that sufficient to afford the desired range of crosslinking. The minimum amount of initiator is typically at least about 0.05, preferably at least about 0.1 and more preferably at least about 0.25, wt % based upon the weight of the polymer or polymers to be crosslinked. The maximum amount of initiator used in these compositions can vary widely, and it is typically determined by such factors as cost, efficiency and degree of desired crosslinking desired.

The maximum amount is typically less than about 10, preferably less than about 5 and more preferably less than about 3, wt % based upon the weight of the polymer or polymers to be crosslinked.

Free radical crosslinking initiation via electromagnetic radiation, e.g., sunlight, ultraviolet (UV) light, infrared (IR) radiation, electron beam, beta-ray, gamma-ray, x-ray and neutron rays, may also be employed. Radiation is believed to affect crosslinking by generating polymer radicals, which may combine and crosslink. The Handbook of Polymer Foams and Technology, supra, at pp. 198-204, provides additional teachings. Elemental sulfur may be used as a crosslinking agent for diene containing polymers such as EPDM and polybutadiene. The amount of radiation used to cure the copolymer will vary with the chemical composition of the copolymer, the composition and amount of initiator, if any, the nature of the radiation, and the like, but a typical amount of UV light is at least about 0.05, more typically at about 0.1 and even more typically at least about 0.5, Joules/cm$^2$, and a typical amount of E-beam radiation is at least about 0.5, more typically at least about 1 and even more typically at least about 1.5, megarads.

If sunlight or UV light is used to effect cure or crosslinking, then typically and preferably one or more photoinitiators are employed. Such photoinitiators include organic carbonyl compounds such as such as benzophenone, benzanthrone, benzoin and alkyl ethers thereof, 2,2-diethoxyacetophenone, 2,2-dimethoxy, 2 phenylacetophenone, p-phenoxy dichloro-acetophenone, 2-hydroxycyclohexylphenone, 2-hydroxyisopropylphenone, and 1-phenylpropanedione-2-(ethoxy carboxyl)oxime. These initiators are used in known manners and in known quantities, e.g., typically at least about 0.05, more typically at least about 0.1 and even more typically about 0.5, wt % based on the weight of the copolymer.

If moisture, i.e., water, is used to effect cure or crosslinking, then typically and preferably one or more hydrolysis/condensation catalysts are employed. Such catalysts include Lewis acids such as dibutyltin dilaurate, dioctyltin dilaurate, stannous octonoate, and hydrogen sulfonates such as sulfonic acid.

Free radical crosslinking coagents, i.e. promoters or co-initiators, include multifunctional vinyl monomers and polymers, triallyl cyanurate and trimethylolpropane trimethacrylate, divinyl benzene, acrylates and methacrylates of polyols, allyl alcohol derivatives, and low molecular weight polybutadiene. Sulfur crosslinking promoters include benzothiazyl disulfide, 2-mercaptobenzothiazole, copper dimethyldithiocarbamate, dipentamethylene thiuram tetrasulfide, tetrabutylthiuram disulfide, tetramethylthiuram disulfide and tetramethylthiuram monosulfide.

These coagents are used in known amounts and known ways. The minimum amount of coagent is typically at least about 0.05, preferably at least about 0.1 and more preferably at least about 0.5, wt % based upon the weight of the polymer or polymers to be crosslinked. The maximum amount of coagent used in these compositions can vary widely, and it is typically determined by such factors as cost, efficiency and degree of desired crosslinking desired. The maximum amount is typically less than about 10, preferably less than about 5 and more preferably less than about 3, wt % based upon the weight of the polymer or polymers to be crosslinked.

One difficulty in using thermally activated free radical initiators to promote crosslinking, i.e., curing, of thermoplastic materials is that they may initiate premature crosslinking, i.e., scorch, during compounding and/or processing prior to the actual phase in the overall process in which curing is desired. With conventional methods of compounding, such as milling, Banbury, or extrusion, scorch occurs when the time-temperature relationship results in a condition in which the free radical initiator undergoes thermal decomposition which, in turn, initiates a crosslinking reaction that can create gel particles in the mass of the compounded polymer. These gel particles can adversely impact the homogeneity of the final product. Moreover, excessive scorch can so reduce the plastic properties of the material that it cannot be efficiently processed with the likely possibility that the entire batch will be lost.

One method of minimizing scorch is the incorporation of scorch inhibitors into the compositions. For example, British patent 1,535,039 discloses the use of organic hydroperoxides as scorch inhibitors for peroxide-cured ethylene polymer compositions. U.S. Pat. No. 3,751,378 discloses the use of N-nitroso diphenylamine or N,N'-dinitroso-para-phenylamine as scorch retardants incorporated into a polyfunctional acrylate crosslinking monomer for providing long Mooney scorch times in various elastomer formulations. U.S. Pat. No. 3,202,648 discloses the use of nitrites such as isoamyl nitrite, tert-decyl nitrite and others as scorch inhibitors for polyethylene. U.S. Pat. No. 3,954,907 discloses the use of monomeric vinyl compounds as protection against scorch. U.S. Pat. No. 3,335,124 describes the use of aromatic amines, phenolic compounds, mercaptothiazole compounds, bis(N,N-disubstituted-thiocarbamoyl)sulfides, hydroquinones and dialkyldithiocarbamate compounds. U.S. Pat. No. 4,632,950 discloses the use of mixtures of two metal salts of disubstituted dithiocarbamic acid in which one metal salt is based on copper.

One commonly used scorch inhibitor for use in free radical, particularly peroxide, initiator-containing compositions is 4-hydroxy-2,2,6,6-tetramethylpiperidin-1-oxyl also known as nitroxyl 2, or NR 1, or 4-oxypiperidol, or tanol, or tempol, or tmpn, or probably most commonly, 4-hydroxy-TEMPO or even more simply, h-TEMPO. The addition of 4-hydroxy-TEMPO minimizes scorch by "quenching" free radical crosslinking of the crosslinkable polymer at melt processing temperatures.

The preferred amount of scorch inhibitor used in the compositions of this invention will vary with the amount and nature of the other components of the composition, particularly the free radical initiator, but typically the minimum amount of scorch inhibitor used in a system of polyolefin elastomer with 1.7 weight percent (wt %) peroxide is at least about 0.01, preferably at least about 0.05, more preferably at least about 0.1 and most preferably at least about 0.15, wt % based on the weight of the polymer. The maximum amount of scorch inhibitor can vary widely, and it is more a function of cost and efficiency than anything else. The typical maximum amount of scorch inhibitor used in a system of ethylene multi-block copolymer with 1.7 wt % peroxide does not exceed about 2, preferably does not exceed about 1.5 and more preferably does not exceed about 1, wt % based on the weight of the polymer.

Any silane that will effectively graft to and crosslink the ethylene multi-block copolymer can be used in the practice of this invention. Suitable silanes include unsaturated silanes that comprise an ethylenically unsaturated hydrocarbyl group, such as a vinyl, allyl, isopropenyl, butenyl, cyclohexenyl or (-(meth)acryloxy allyl group, and a hydrolyzable group, such as, for example, a hydrocarbyloxy, hydrocarbonyloxy, or hydrocarbylamino group. Examples of hydrolyzable groups include methoxy, ethoxy, formyloxy, acetoxy, proprionyloxy, and alkyl or arylamino groups. Preferred silanes are the unsaturated alkoxy silanes which can be grafted onto the polymer. These silanes and their method of preparation are more fully described in U.S. Pat. No. 5,266,627. Vinyl trimethoxy silane, vinyl triethoxy silane, (-(meth) acryloxy propyl trimethoxy silane and mixtures of these silanes are the preferred silane crosslinkers for is use in this invention. If filler is present, then preferably the crosslinker includes vinyl triethoxy silane.

The amount of silane crosslinker used in the practice of this invention can vary widely depending upon the nature of the ethylene multi-block copolymer, the silane, the processing conditions, the grafting efficiency, the ultimate application, and similar factors, but typically at least 0.1, preferably at least 1, wt % is used. Considerations of convenience and economy are usually the two principal limitations on the maximum amount of silane crosslinker used in the practice of this invention, and typically the maximum amount of silane crosslinker does not exceed 5, preferably it does not exceed 3, wt % based on the weight of the ethylene multi-block copolymer.

The silane crosslinker is grafted to the ethylene multi-block copolymer by any conventional method, typically in the presence of a free radical initiator e.g. peroxides and azo compounds, or by ionizing radiation, etc. Organic initiators are preferred, such as any of those described above, e.g., the peroxide and azo initiators. The amount of initiator can vary, but it is typically present in the amounts described above for the crosslinking of the ethylene multi-block copolymer.

While any conventional method can be used to graft the silane crosslinker to the ethylene multi-block copolymer, one preferred method is blending the two with the initiator in the first stage of a reactor extruder, such as a Buss kneader. The grafting conditions can vary, but the melt temperatures are typically between 160 and 260 C, preferably between 190 and 230 C, depending upon the residence time and the half life of the initiator.

In another embodiment of the invention, the polymeric material further comprises a graft polymer to enhance the adhesion to one or more glass cover sheets to the extent that these sheets are components of the electronic device module. While the graft polymer can be any graft polymer compatible with the ethylene multi-block copolymer of the polymeric material and which does not significantly compromise the performance of the copolymer as a component of the module, typically the graft polymer is a graft polyolefin polymer and more typically, a graft ethylene multi-block copolymer that is of the same composition as the ethylene multi-block copolymer of the polymeric material. This graft additive is typically made in situ simply by subjecting the ethylene multi-block copolymer to grafting reagents and grafting conditions such that at least a portion of the ethylene multi-block copolymer is grafted with the grafting material.

Any unsaturated organic compound containing at least one ethylenic unsaturation (e.g., at least one double bond), at least one carbonyl group (—C═O), and that will graft to a polymer, particularly a polyolefin polymer and more particularly to an ethylene multi-block copolymer, can be used as the grafting material in this embodiment of the invention. Representative of compounds that contain at least one carbonyl group are the carboxylic acids, anhydrides, esters and their salts, both metallic and nonmetallic. Preferably, the organic compound contains ethylenic unsaturation conjugated with a carbonyl group. Representative compounds include maleic, fumaric, acrylic, methacrylic, itaconic, crotonic, ∀-methyl crotonic, and cinnamic acid and their anhydride, ester and salt derivatives, if any. Maleic anhydride is the preferred unsaturated organic compound containing at least one ethylenic unsaturation and at least one carbonyl group.

The unsaturated organic compound content of the graft polymer is at least about 0.01 wt %, and preferably at least about 0.05 wt %, based on the combined weight of the polymer and the organic compound. The maximum amount of unsaturated organic compound content can vary to convenience, but typically it does not exceed about 10 wt %, preferably it does not exceed about 5 wt %, and more preferably it does not exceed about 2 wt %.

The unsaturated organic compound can be grafted to the polymer by any known technique, such as those taught in U.S. Pat. Nos. 3,236,917 and 5,194,509. For example, in the '917 patent the polymer is introduced into a two-roll mixer and mixed at a temperature of 60 C. The unsaturated organic compound is then added along with a free radical initiator, such as, for example, benzoyl peroxide, and the components are mixed at 30 C until the grafting is completed. In the '509 patent, the procedure is similar except that the reaction temperature is higher, e.g., 210 to 300 C, and a free radical initiator is not used or is used at a reduced concentration.

An alternative and preferred method of grafting is taught in U.S. Pat. No. 4,950,541 by using a twin-screw devolatilizing extruder as the mixing apparatus. The polymer and unsaturated organic compound are mixed and reacted within the extruder at temperatures at which the reactants are molten and in the presence of a free radical initiator. Preferably, the unsaturated organic compound is injected into a zone maintained under pressure within the extruder.

The polymeric materials of this invention can comprise other additives as well. For example, such other additives include UV-stabilizers and processing stabilizers such as trivalent phosphorus compounds. The UV-stabilizers are useful in lowering the wavelength of electromagnetic radiation that can be absorbed by a PV module (e.g., to less than 360 nm), and include hindered phenols such as Cyasorb UV2908 and hindered amines such as Cyasorb UV 3529, Hostavin N30, Univil 4050, Univin 5050, Chimassorb UV 119, Chimassorb 944 LD, Tinuvin 622 LD and the like. The phosphorus compounds include phosphonites (PEPQ) and phosphites (Weston 399, TNPP, P-168 and Doverphos 9228). The amount of UV-stabilizer is typically from about 0.1 to 0.8%, and preferably from about 0.2 to 0.5%. The amount of processing stabilizer is typically from about 0.02 to 0.5%, and preferably from about 0.05 to 0.15%.

Still other additives include, but are not limited to, antioxidants (e.g., hindered phenolics (e.g., Irganox® 1010 made by Ciba Geigy Corp.), cling additives, e.g., PIB, anti-blocks, anti-slips, pigments and fillers (clear if transparency is important to the application). In-process additives, e.g. calcium stearate, water, etc., may also be used. These and other potential additives are used in the manner and amount as is commonly known in the art.

The polymeric materials of this invention are used to construct electronic device modules in the same manner and using the same amounts as the encapsulant materials known in the art, e.g., such as those taught in U.S. Pat. No. 6,586,271, US Patent Application Publication US2001/0045229 A1, WO 99/05206 and WO 99/04971. These materials can be used as "skins" for the electronic device, i.e., applied to one or both face surfaces of the device, or as an encapsulant in which the device is totally enclosed within the material. Typically, the polymeric material is applied to the device by one or more lamination techniques in which a layer of film formed from the polymeric material is applied first to one face surface of the device, and then to the other face surface of the device. In an alternative embodiment, the polymeric material can be extruded in molten form onto the device and allowed to congeal on the device. The polymeric materials of this invention exhibit good adhesion for the face surfaces of the device.

In one embodiment, the electronic device module comprises (i) at least one electronic device, typically a plurality of such devices arrayed in a linear or planar pattern, (ii) at least one glass cover sheet, typically a glass cover sheet over both face surfaces of the device, and (iii) at least one polymeric material. The polymeric material is typically disposed between the glass cover sheet and the device, and the polymeric material exhibits good adhesion to both the device and the sheet. If the device requires access to specific forms of electromagnetic radiation, e.g., sunlight, infrared, ultra-violet, etc., then the polymeric material exhibits good, typically excellent, transparency for that radiation, e.g., transmission rates in excess of 90, preferably in excess of 95 and even more preferably in excess of 97, percent as measured by UV-vis spectroscopy (measuring absorbance in the wavelength range of about 250-1200 nanometers. An alternative measure of transparency is the internal haze method of ASTM D1003-00. If transparency is not a requirement for operation of the electronic device, then the polymeric material can contain opaque filler and/or pigment.

In FIG. 1, rigid PV module 10 comprises photovoltaic cell 11 surrounded or encapsulated by transparent protective layer or encapsulant 12 comprising an ethylene multi-block copolymer used in the practice of this invention. Glass cover sheet 13 covers a front surface of the portion of the transparent protective layer disposed over PV cell 11. Backskin or back sheet 14, e.g., a second glass cover sheet or another substrate of any kind, supports a rear surface of the portion of transparent protective layer 12 disposed on a rear surface of PV cell 11. Backskin layer 14 need not be transparent if the surface of the PV cell to which it is opposed is not reactive to sunlight. In this embodiment, protective layer 12 encapsulates PV cell 11. The thicknesses of these layers, both in an absolute context and relative to one another, are not critical to this invention and as such, can vary widely depending upon the overall design and purpose of the module. Typical thicknesses for protective layer 12 are in the range of about 0.125 to about 2 millimeters (mm), and for the glass cover sheet and backskin layers in the range of about 0.125 to about 1.25 mm. The thickness of the electronic device can also vary widely.

Figure 2:
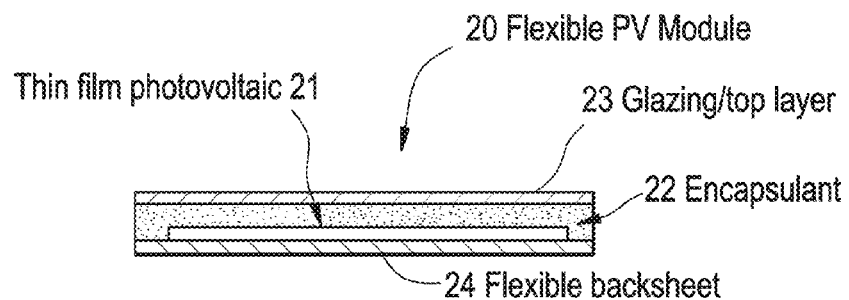
FIG. 2 is a schematic of another embodiment of an electronic device module of this invention, i.e., a flexible PV module.

In FIG. 2, flexible PV module 20 comprises thin film photovoltaic 21 over-lain by transparent protective layer or encapsulant 22 comprising an ethylene multi-block copolymer used in the practice of this invention. Glazing/top layer 23 covers a front surface of the portion of the transparent protective layer disposed over thin film PV 21. Flexible backskin or back sheet 24, e.g., a second protective layer or another flexible substrate of any kind, supports the bottom surface of thin film PV 21. Backskin layer 24 need not be transparent if the surface of the thin film cell which it is supporting is not reactive to sunlight. In this embodiment, protective layer 21 does not encapsulate thin film PV 21. The overall thickness of a typical rigid or flexible PV cell module will typically be in the range of about 5 to about 50 mm.

The modules described in FIGS. 1 and 2 can be constructed by any one of a number of different methods, typically a film or sheet co-extrusion method such as blown-film, modified blown-film, calendaring and casting. In one method and referring to FIG. 1, protective layer 12 is formed by first extruding an ethylene multi-block copolymer over and onto the top surface of the PV cell and either simultaneously with or subsequent to the extrusion of this first extrusion, extruding the same ethylene multi-block copolymer or a different polymer over and onto the back surface of the PV cell. Once the protective film is attached the PV cell, the glass cover sheet and backskin layer can be attached in any convenient manner, e.g., extrusion, lamination, etc., to the protective layer, with or without an adhesive. Either or both external surfaces, i.e., the surfaces opposite the surfaces in contact with the PV cell, of the protective layer can be embossed or otherwise treated to enhance adhesion to the glass and backskin layer. The module of FIG. 2 can be constructed in a similar manner, except that the backskin layer is attached to the PV cell directly, with or without an adhesive, either prior or subsequent to the attachment of the protective layer to the PV cell.

The following prophetic examples further illustrate the invention. Unless otherwise indicated, all parts and percentages are by weight.

SPECIFIC EMBODIMENTS

Example A

A monolayer 15 mil thick protective cast film is made from a blend comprising 80 wt % ethylene/1-octene multi-block copolymer (5 MI, 0.87 g/cc overall density; 30% hard segment, 70% soft segment having a density of about 0.85 g/cc), 20 wt % maleic anhydride (MAH) modified ethylene/1-octene (ENGAGE® polyolefin grafted at a level of about 1 wt % MAH and having a post-modified MI of about 1.25 g/10 min and a density of about 0.87 g/cc), 0.1 wt % of Chimassorb® 944, 0.2 wt % of Naugard® P, and 0.3 wt % of Cyasorb® UV 531. A Solar cell module is prepared using a solar cell lamination process at 15° C. in which the protective film is located between a transparent superstrate (usually glass) and the solar cell, and between the solar cell and a backskin material.

Example B

A monolayer 15 mil thick protective cast film is made from a blend comprising 90 wt % ethylene/1-octene multi-block copolymer (5 MI, 0.87 g/cc overall density; 30% hard segment, 70% soft segment having a density of about 0.85 g/cc), 10 wt % maleic anhydride (MAH) modified ethylene/1-octene (ENGAGE® polyolefin grafted at a level of about 1 wt % MAH and having a post-modified MI of about 1.25 g/10 min and a density of about 0.87 g/cc), 0.1 wt % of Chimassorb® 944, 0.2 wt % of Naugard® P, and 0.3 wt % of Cyasorb® UV 531. A Solar cell module is prepared using a solar cell lamination process at 15° C. in which the protective film is located between a transparent superstrate (usually glass) and the solar cell, and between the solar cell and a backskin material.

Formulation and Processing Procedures:
Step 1: Use ZSK-30 extruder with Adhere Screw to compound resin and additive package with Amplify.
Step 2: Dry the material from Step 2 for 4 hour at 100 F maximum (use W&C canister dryers).

TABLE 1

| Formulation | |
|---|---|
| Sample No. | 1 |
| Ethylene/1-Octene Multi-Block Copolymer (5 MI, 0.868 den.) | 79.3 |
| Amplify GR 216 (1.3 MI, 0.879 den - 1% MAH grafted ENGAGE ®) | 20 |
| Cyasorb UV 531 | 0.3 |
| Chimassorb 944 LD | 0.1 |
| Tinuvin 622 LD | 0.1 |
| Naugard P | 0.2 |
| Total | 100 |

Test Methods and Results:

The adhesion with glass is measured using silane-treated glass. The procedure of glass treatment is adapted it from a procedure in Gelest, Inc. "Silanes and Silicones, Catalog 3000 A".

Approximately 10 mL of acetic acid is added to 200 mL of 95% ethanol in order to make the solution slightly acidic. Then, 4 mL of 3-aminopropyltrimethoxysilane is added with stirring, making a ~2% solution of silane. The solution sits for 5 minutes to allow for hydrolysis to begin, and then it is transferred to a glass dish. Each plate is immersed in the solution for 2 minutes with gentle agitation, removed, rinsed briefly with 95% ethanol to remove excess silane, and allowed to drain. The plates are cured in an oven at 110° C. for 15 minutes. Then, they are soaked in a 5% solution of sodium bicarbonate for 2 minutes in order to convert the acetate salt of the amine to the free amine. They are rinsed with water, wiped dry with a paper towel, and air dried at room temperature overnight.

The method for testing the adhesion strength between the polymer and glass is the 180 peel test. This is not an ASTM standard test, but it is used to examine the adhesion with glass for PV modules. The test sample is prepared by placing uncured film on the top of the glass, and then curing the film under pressure in a compression molding machine. The molded sample is held under laboratory conditions for two days before the test. The adhesion strength is measured with an Instron machine. The loading rate is 2 in/min, and the test is run under ambient conditions. The test is stopped after a stable peel region is observed (about 2 inches). The ratio of peel load over film width is reported as the adhesion strength.

Several important mechanical properties of the cured films are evaluated using tensile and dynamic mechanical analysis (DMA) methods. The tensile test is run under ambient conditions with a load rate of 2 in/min. The DMA method is conducted from −100 to 120 C. The optical properties are determined as follows: Percent of light transmittance is measured by UV-vis spectroscopy. It measures the absorbance in the wavelength of 250 nm to 1200 nm. The internal haze is measured using ASTM D1003-61.

The results are reported in Table 2. The EVA is a fully formulated film available from Etimex.

TABLE 2

| Test Results | | |
|---|---|---|
| Key Properties | EVA | 1 |
| Elongation to break (%) | 411.7 | 1439.3 |
| STDV | 17.5 | 17.7 |
| Tensile strength at 85° C. (psi) | 51.2 | 71.5 |
| STDV | 8.9 | 10 |
| Elongation to break at 85° C. (%) | 77.1 | 107.2 |
| STDV | 16.3 | 16.5 |
| Adhesion with glass (N/mm) | 7 | 2 |
| % of transmittance | >97 | >95 |
| STDV | 0.1 | 0.3 |
| Internal Haze | 2.8 | 18.9 |
| STDV | 0.4 | 1.5 |

STDV = Standard Deviation.

As shown by the data of Table 2, the ethylene/1-octene multi-block copolymer provided much superior elongation to break, tensile strength and elongation to break at 85 C as compared with the EVA polymer with little diminution in adhesion to glass strength and optics.

Example C

Block Copolymer Polyolefin-Based Encapsulant Film

An ethylene/1-octene block copolymer developed by The Dow Chemical Company is used for this example. The density of this resin is 0.877 g/cm$^3$ and melt index is 5 g/10 min (measured based on standard ASTM D1238, condition 190 C/2.16 kg). The resin contains 1000 ppm of antioxidant Irganox-168. Several additives are selected to add functionality or improve the long term stability of the resin. The additives are UV-absorbent Cyasorb UV 531, UV-stabilizer Chimassorb 944 LD, antioxidant Tinuvin 622 LD, vinyltrimethoxysilane (VTMS), and peroxide Luperox-101. The formulation (by weight) is listed in Table 3.

TABLE 3

| Film Formulation | |
|---|---|
| Formulation Component | Weight percent |
| Ethylene/1-octene block copolymer (MI 5, 0.877 den.) | 98.45 |
| Cyasorb UV 531 | 0.3 |
| Chimassorb 944 LD | 0.1 |
| Tinuvin 622 LD | 0.1 |
| Irganox-168 | |
| Silane (Dow Corning Z-6300) | 1 |
| Luperox-101 | 0.05 |
| Total | 100 |

TABLE 4

| Ethylene/1-Octene Block Copolymer Composition | | | | | |
|---|---|---|---|---|---|
| Overall Octene (mol %) | Octene in soft (mol %) | Octene in hard (mol %) | Overall Octene (wt %) | Octene in soft (wt %) | Octene in hard (wt %) |
| 12.7 | 17.8 | 0.8 | 36.8 | 46.4 | 3.1 |

TABLE 5

| Ethylene/1-Octene Block Copolymer Physical Properties | | | | | | | | | |
|---|---|---|---|---|---|---|---|---|---|
| Property | | | | | | | | | |
| Density (g/cm$^3$) | $I_2$ | $I_{10}$ | $I_{10}/I_2$ | Mw (g/mol) | Mn (g/mol) | Mw/Mn | Heat of Fusion (J/g) | $T_m$ (° C.) | $T_c$ (° C.) |
| 0.877 | 5.0 | 35.7 | 7.1 | 85090 | 33130 | 2.6 | 50 | 123 | 102 |

Sample Preparation

Ethyene/1-octene block copolymer pellets are dried at 40° C. overnight in a dryer. The pellets and the additives are dry mixed and placed in a drum and tumbled for 30 minutes. Then the silane and peroxide are poured into the drum and tumbled for another 15 minutes. The well mixed materials are fed to a film extruder for film casting. Film is cast on a film line (Killion Single Screw Extruder, 24 inches sheet die), and the processing conditions are summarized in Table 6

TABLE 6

| | | | | Process Conditions | | | | | |
|---|---|---|---|---|---|---|---|---|---|
| Form. # | RPM | Amp | Head P (psi) | Zone 1 (F) | Zone 2 (F) | Zone 3 (F) | Ext. Ad. (F) | Die Ad. (C) | Die (C) |
| 2 | 30 | 20 | 2,600 | 300 | 350 | 360 | 375 | 192 | 180 |

An 18-19 mil thick film is saved at 5.9 ft./min. The film sample is sealed in an aluminum bag to avoid UV irradiation and moisture.

Test Methods and Results

The following key properties of the film are tested.

1. Optical Property:

The light transmittance of the film is examined by UV-visible spectrometer (Perkin Elmer UV-Vis 950 with scanning double monochromator and integrating sphere accessory) after compression molding the initial cast film at a temperature of about 150 C for 30 minutes and subsequently quenching to room temperature by placing the film between 2 cold (20 C) platens, to achieve a final film thickness of about 15 mils. Samples used in this analysis are 15 mil thick. The UV-Visible spectra of the film is compared to a commercial incumbent film for the same application. Both films show above 90% of transmittance over the wavelength range from 400 nm to 1100 nm.

2. Adhesion to Glass:

The method used to measure adhesion test is a 180° peel test. This is not an ASTM standard test, but has been used to examine the adhesion with glass for PV module and auto laminate glass applications. The test sample is prepared by placing the film on the top of glass under pressure in a compression molding machine. The desired adhesion width is 1 in. A Teflon sheet is placed between the glass and the material to separate the glass and polymer for the purpose of test setup. The conditions for the glass/film sample preparation are listed below:

1) 160° C. for 3 min at 2000 lbs
2) 160° C. for 30 min at 8000 lbs
3) Cool to room temperature at 8000 lbs.
4) Remove the sample from the chase and allow 48 hours for the material to condition at room temperature before the adhesion test.

The adhesion strength is measured with a materials testing system (Instron 5581). The loading rate is 2-inches per minute and the tests are run at ambient conditions (24° C. and 50% RH). A stable peel region is needed (about 2 inches) to evaluate the adhesion to glass. The ratio of peel load in the stable peel region over the film width was reported as the adhesion strength.

The effect of temperature and moisture on adhesion strength is examined using samples aged in hot water (80° C.) for one week. These samples are molded on glass, then immersed in hot water for one week. These samples are then dried under lab conditions for two day before the adhesion test. In comparison, the adhesion strength of a commercial film is also evaluated under the same conditions. The adhesion strength of film and a commercial sample are shown in Table 7.

TABLE 7

| | Results of Adhesion Test to Glass | | |
|---|---|---|---|
| Sample Information | Conditions for Molding on Glass | Aging Condition | Adhesion Strength (N/mm) |
| Commercial film (cured) | 160 C., one hr | none | 10 |
| Commercial (cured) | 160 C., one hr | 80 C. in water for one week | 1 |
| Inventive film | 160 C., 0.5 hr | none | >10 (no delamination) |
| Inventive film | 160 C., 0.5 hr | 80 C. in water for one week | 10 |

3. Water Vapor Transmission Rate:

The water vapor transmission rate (WVTR) is measured using a permeation analysis instrument (Mocon Permatran W Model 101 K). All WVTR units are in grams per 100-square inches per day (g/(100 in$^2$-day) measured at 38 C and 50 C and 100% relative humidity (RH), average of two specimens. Commercial film is also tested to compare the moisture barrier properties. The experimental film and the commercial film thickness are 15 mil, and both films are cured at 160° C. for 30 minutes. The results of WVTR are shown in Table 8.

TABLE 8

| | | WVTR Test Results | | | | |
|---|---|---|---|---|---|---|
| Film | Specimen | WVTR at 38 C. g/(m$^2$-day) | WVTR at 50 C. g/(m$^2$-day) | Thick mil | Permeation at 38 C. (g-mil)/(m$^2$-day) | Permeation at 50 C. (g-mil)/(m$^2$-day) |
| Commercial | A | 44.52 | 98.74 | 16.80 | 737 | 1660 |
| Film | B | 44.54 | 99.14 | 16.60 | 749 | 1641 |
| | avg. | 44.53 | 98.94 | 16.70 | 743 | 1650 |

TABLE 8-continued

WVTR Test Results

| Film | Specimen | WVTR at 38 C. g/(m²-day) | WVTR at 50 C. g/(m²-day) | Thick mil | Permeation at 38 C. (g-mil)/(m²-day) | Permeation at 50 C. (g-mil)/(m²-day) |
|---|---|---|---|---|---|---|
| Inventive Film | A | 5.31 | 12.78 | 18.60 | 99 | 238 |
| | B | | 13.13 | 18.80 | — | 246 |
| | avg. | 5.31 | 12.95 | 18.70 | 99 | 242 |

As the data in Table 8 shows, the WVTR of the inventive film is much less permeable to water vapor than the commercial film.

Although the invention has been described in considerable detail through the preceding description and examples, this detail is for the purpose of illustration and is not to be construed as a limitation on the scope of the invention as it is described in the claims. All United States patents, published patent applications and allowed patent applications identified above are incorporated herein by reference.

We claim:

1. An electronic device module comprising:
    A. At least one solar cell,
    B. An encapsulant film in intimate contact with at least one surface of the solar cell and comprising a polymeric material, the polymeric material comprising a reaction product of at least: (1) an ethylene multi-block copolymer characterized by (i) a molecular fraction that elutes between about 40 C and about 130 C when fractionated using TREF, characterized in that the fraction has a block index of at least 0.5 and up to about 1 and a MWD greater than about 1.3, (ii) an average block index greater than zero and up to about 1.0 and an MWD greater than about 1.3, (iii) a melt point of less than about 125 C, (iv) a density of from less than 0.89 g/cc to greater than 0.85 g/cc, and (v) having at least one property of (a) a 2% secant modulus of less than about 150 megaPascal (mPa) as measured by ASTM D-882-02, (b) an α-olefin content of at least about 10 and less than about 80 weight percent (wt %) based on the weight of the copolymer, and (c) a Tg of less than about −35 C, (2) a vinyl silane in an amount of at least about 0.1 wt % based on the weight of the copolymer, and (3) optionally, a co-agent, wherein the polymeric material has greater than or equal to 92% transmittance over the wavelength range of 400 to 1100 nanometers, and a water vapor transmission rate of less than about 50 grams per square meters per day (g/m²-day),
    C. A cover sheet in intimate contact with at least a portion of the encapsulant film, and
    D. A backsheet in intimate contact with at least one of the solar cell and the encapsulant film,
    wherein the encapsulant film is between the cover sheet and the backsheet.

2. The module of claim 1 comprising the coagent present in an amount of at least about 0.05 wt % based on the weight of the copolymer.

3. The module of claim 2 further comprising a free radical initiator which is a peroxide.

4. The module of claim 3 in which the vinyl silane is at least one of vinyl tri-ethoxy silane and vinyl tri-methoxy silane.

5. The module of claim 1 in which the polyolefin copolymer is crosslinked such that the copolymer contains less than about 70 percent xylene soluble extractables as measured by ASTM 2765-95.

6. The module of claim 1 in which the encapsulant film is a monolayer film.

7. The module of claim 1 in which the polymeric material further comprises a scorch inhibitor in an amount from 0.01 to about 1.7 wt %.

8. The module of claim 1 in which the polymeric material further comprises a polyolefin polymer grafted with an unsaturated organic compound containing at least one ethylenic unsaturation and at least one carbonyl group.

9. The module of claim 8 in which the unsaturated organic compound is maleic anhydride.

10. An electronic device module comprising:
    A. A solar cell, and
    B. An encapsulant film in intimate contact with at least one surface of the electronic device and comprising a polymeric material, the polymeric material comprising an ethylene multi-block copolymer characterized by (i) a molecular fraction that elutes between about 40 C and about 130 C when fractionated using TREF, characterized in that the fraction has a block index of at least 0.5 and up to about 1 and a MWD greater than about 1.3, (ii) an average block index greater than zero and up to about 1 and a MWD greater than about 1.3, (iii) a density of from less than 0.89 g/cc to greater than 0.85 g/cc, and (iv) having at least one property of (a) a 2% secant modulus of less than about 150 megaPascal (mPa) as measured by ASTM D-822-02, (b) a melt point of less than about 125 C, (c) an α-olefin content of at least about 10 and less than about 80 weight percent (wt %) based on the weight of the copolymer, and (d) a Tg of less than about −35 C,
    wherein the polymeric material has greater than or equal to 92% transmittance over the wavelength range of 400 to 1100 nanometers, and a water vapor transmission rate of less than about 50 grams per square meters per day (g/m²-day),
    C. A cover sheet in intimate contact with at least a portion of the encapsulant film, and
    D. A backsheet in intimate contact with at least one of the solar cell and the encapsulant film
    wherein the encapsulant film is between the cover sheet and the backsheet.

11. The electronic device module of claim 1 in which the encapsulant film is a co-extruded film in which at least one outer skin layer (i) does not contain peroxide for crosslinking, and (ii) is the surface which comes into intimate contact with the module.

12. The electronic device module of claim 11 in which the co-extruded film comprises at least three layers.

13. The electronic device module of claim 12 in which a core layer of the encapsulant film contains peroxide.

14. The electronic device module of claim 1 in which encapsulant film fully encapsulates the solar cell and the backsheet is in intimate contact with at least a portion of the encapsulant film.

15. The electronic device module of claim 1 in which the backsheet is in intimate contact with at least one surface of the solar cell.

16. The electronic device module of claim 10 in which the encapsulant film fully encapsulates the solar cell and the backsheet is in intimate contact with at least a portion of the encapsulant film.

17. The electronic device module of claim 10 in which the backsheet is in intimate contact with at least one surface of the solar cell.

* * * * *